(12) United States Patent
Hardt et al.

(10) Patent No.: US 7,573,220 B2
(45) Date of Patent: Aug. 11, 2009

(54) SELF CALIBRATING FAN

(75) Inventors: Eric A. Hardt, Tempe, AZ (US); Scott Frankel, Gilbert, AZ (US)

(73) Assignee: Minebea Co., Ltd. (JP)

( * ) Notice: Subject to any disclaimer, the term of this patent is extended or adjusted under 35 U.S.C. 154(b) by 0 days.

(21) Appl. No.: 11/715,130

(22) Filed: Mar. 6, 2007

(65) Prior Publication Data
US 2007/0156361 A1    Jul. 5, 2007

Related U.S. Application Data

(62) Division of application No. 10/835,734, filed on Apr. 30, 2004, now Pat. No. 7,202,624.

(51) Int. Cl.
*H02P 1/04* (2006.01)

(52) U.S. Cl. .................. 318/461; 318/471; 318/400.08; 318/634; 318/641

(58) Field of Classification Search .............. 318/461, 318/471, 634, 641, 400.08
See application file for complete search history.

(56) References Cited

U.S. PATENT DOCUMENTS

| | | | | |
|---|---|---|---|---|
| 4,328,549 A | * | 5/1982 | Avery ........................ | 700/122 |
| 5,228,300 A | * | 7/1993 | Shim ........................... | 62/80 |
| 5,292,280 A | * | 3/1994 | Janu et al. .................... | 454/229 |
| 5,847,526 A | * | 12/1998 | Lasko et al. ............... | 318/471 |
| 5,971,846 A | * | 10/1999 | Cho et al. .................... | 454/233 |
| RE36,437 E | | 12/1999 | Hanson et al. | |
| 6,293,778 B1 | * | 9/2001 | Joseph ....................... | 425/72.1 |
| 6,345,238 B1 | * | 2/2002 | Goodwin ................... | 702/130 |
| 6,501,241 B1 | | 12/2002 | Tsurumi et al. | |
| 6,795,268 B1 | | 9/2004 | Ryan | |
| 2003/0128509 A1 | * | 7/2003 | Oudet ......................... | 361/687 |

OTHER PUBLICATIONS

International Preliminary Report on Patentability/ Written Opinion for PCT Application No. PCT/US2005/014618, filed Apr. 25, 2007, dated Sep. 27, 2007, 12 pages total.

* cited by examiner

*Primary Examiner*—Walter Benson
*Assistant Examiner*—Renata McCloud
(74) *Attorney, Agent, or Firm*—Townsend and Townsend and Crew LLP

(57) ABSTRACT

A self-calibrating, continuous variable speed fan for use in cooling electronic circuitry is disclosed. Upon initial power-up, in an environment of known temperature, the self-calibrating fan accommodates for the tolerances of its electronic components by reading a voltage from its thermistor array and comparing the actual value to an expected value for the given temperature. The difference is then stored in the non-volatile memory of a microcontroller for use in adjusting future voltage readings from the thermistor array. During normal operation, adjusted readings from the thermistor array are then converted by the microcontroller into a control signal for driving the motor of a cooling fan. A quickly cycling stochastic process between adjustments to fan motor speed and temperature readings is then established, thereby maintaining a high degree of control over the device to be cooled.

11 Claims, 6 Drawing Sheets

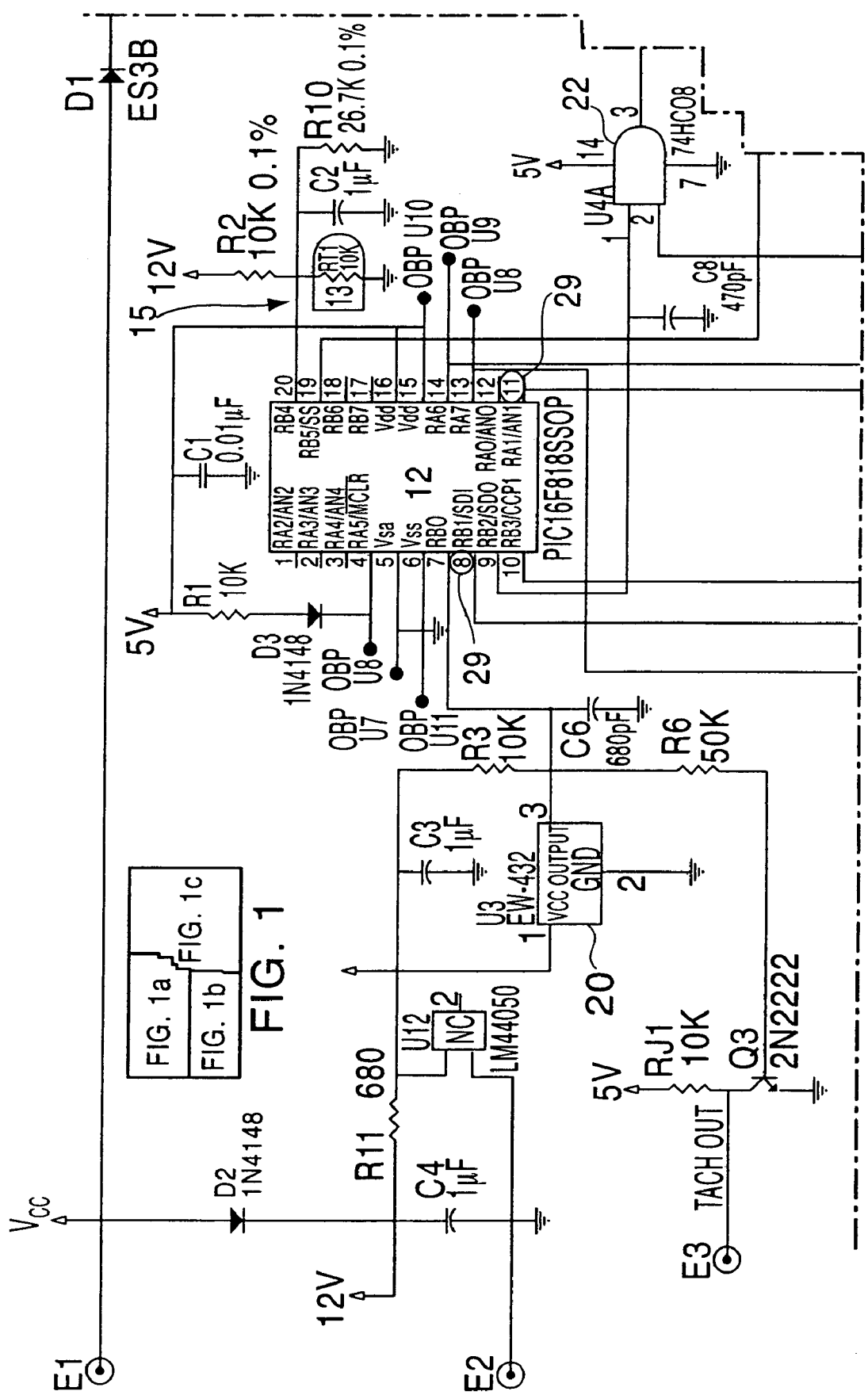

Ized DCTICLESS TZZZKSELF CALIBRATING FAN

BACKGROUND OF THE INVENTION

1. Field of the Invention

The present invention is directed toward a fan for use in cooling circuitry found in electronic equipment. More particularly, the present invention provides a highly accurate and highly temperature-sensitive electronic cooling fan capable of responding in real time to minor fluctuations in ambient temperature of the region or device to be cooled using cost-effective moderate to low tolerance componentry without resorting to circuit trimming or discarding a large number of units.

2. Description of the Related Art

Modern electronic devices have a tendency to retain heat when operated for long periods of time, which eventually interferes with proper function of the equipment. Internal cooling systems, such as fans, are therefore required to maintain system integrity and assure proper performance. Cooling fans, however, introduce their own set of drawbacks—most notably among them unwanted noise and unnecessary power consumption. These drawbacks are particularly acute when the fan is required either to run at a single speed or to remain off. To overcome such drawbacks, a variable-speed fan was conceived.

Even designs for variable-speed fans, however, present difficulties in measuring with sufficient accuracy the temperature of the area or circuit to be cooled. Calibrating measurements over a wide range of temperatures can be difficult and costly—particularly considering that the measurement circuit's componentry is often manufactured to moderate or low tolerances for the sake of cost savings. A continuous-variable speed fan capable of calibrating temperature measurements across a wide temperature range in a highly cost-effective manner was therefore conceived.

Related art falls into two broad categories: fans with speed control, and calibration means for sensor equipment.

Fans with Speed Control.

The related art regarding fans with speed control includes an intelligent fan system including a microcontroller with memory and an interface to a host computer system including a temperature sensing device connected thereto. Via a communication signal, the microcontroller adjusts the fan motor's rotation speed according to a plurality of control instructions in response to a detected temperature using a speed-temperature curve stored in memory. Each controller is fan specific, i.e., the host machine programs a specific external fan controller board to control a specific fan. Matching appropriate voltage to temperature input and subsequent fan motor rotation is accomplished by programming each of the external fan controllers at the time of manufacture.

The related art also discloses a cooling-fan speed control for use with computers. In auto mode after detecting system configuration, cooling-fan start speeds are retrieved into the system controller from a fan-speed table stored in memory. During operation, cooling-fan speed is increased or decreased in response to the temperature sensed by an ambient air temperature sensor. During manufacturing, an appropriate fan-speed table is written into a controller's memory, and easily rewritten at any time to reflect changes in data.

Also disclosed in the related art is a microprocessor-controlled fan for cooling architectural spaces, such as rooms, within buildings or other dwellings. The fan has a motor responsive to a control signal and excited by a power source having first and second terminals and a first predetermined frequency. The system entails means for selecting a desired temperature and providing a first electrical signal representative thereof, means for sensing an actual temperature and providing a second electrical signal representative thereof, and means, preferably a microprocessor, for receiving, sampling and interpreting the first and second electrical signals. The microprocessor then controls the speed of the fan with respect to the magnitude of the difference measured.

Also available is a system that drives an indoor blower of a heating, ventilating, and air conditioning (HVAC) unit using a system-control signal for determining the air-flow rate of the HVAC by controlling the speed or torque of a motor driving an indoor blower. A microprocessor, with optional analog-to-digital codec and programmable non-volatile (PVN) memory, controls operation of the motor using motor-control signals according to various system parameters, which can be stored in the PVN. The motor-control signals are provided to the electrically commutated motor (ECM) for speed or torque control via the microprocessor in response to a number of system-control signals provided by the system control such as a temperature signal provided by a thermostat. The microprocessor defines an operating mode for the ECM in response to the system control signal. A system controller such as a thermostat activates air conditioning demand to instruct the motor to operate at a speed or torque to drive a fan to deliver a defined air flow for a period of time.

Calibration of Sensor Equipment.

The technology of sensor equipment also discloses a method of calibrating analog sensor measurements in a computer system. A calibrated measurement is created by comparing an analog sensor measurement, such as temperature (either ambient or of particular circuit components) or voltage, to a calibration curve generated by reading from memory two curve-defining values (such as slope and intercept) from a set of such values stored during the manufacturing process. The results of at least two reference sensor measurements, taken during the manufacturing process, are compared against a calibrated scale and then used to calibrate potentially inaccurate in-system analog sensor measurements via a linear algorithm using the initially calibrated values. During operation, a calibrated result is calculated using the analog sensor measurement result and the values that define the curve read from the memory device. During the manufacturing process, each temperature measurement is taken by first bringing the ambient temperature within the computer chassis to a known, calibrated temperature and then performing a sensor measurement operation.

The related art also discloses a microprocessor-controlled fan for cooling architectural spaces, such as rooms, within buildings or other dwellings. The fan comprises a motor responsive to a control signal and excited by a power source having first and second terminals and a first predetermined frequency. The system comprises means for selecting a desired temperature and providing a first electrical signal representative thereof, means for sensing an actual temperature and providing a second electrical signal representative thereof, and means, preferably a microprocessor, for receiving, sampling and interpreting the first and second electrical signals. The microprocessor then controls the speed of the fan with respect to the magnitude of the difference measured.

The related art also discloses a device for indicating refrigerant temperature by connecting a thermistor to an electronic controller that continually measures changes in the resistance of the thermistor, and in turn, drives a compressor clutch and condenser. The thermistor is calibrated at installation by measuring the resistance of the thermistor when constant-temperature air is flowing thereover and then comparing the value measured with a standard value. A correction factor based upon the comparison can then be stored in a non-volatile memory, either within a microcomputer or on external media, for use in later calibrations. For calibration, constant-temperature air is flowed over the thermistor, preferably at 25° C., and the thermistor is operated at a low level of self heat. After stabilization, the resistance of the thermistor is measured and compared with a known standard or nominal value. The results of the comparison are stored in the microprocessor in a non-volatile memory or external memory such as a non-volatile memory, and later used as a correction factor during operation of the control system. When the calibration signal is generated, the microprocessor compares the measured thermistor resistance with a nominal value stored on a look-up table, and then stores the difference as a correction factor in the non-volatile memory of the microprocessor or an external memory such as a non-volatile memory.

SUMMARY OF THE INVENTION

The present invention discloses an apparatus and method for self-calibrating a variable-speed fan for use in cooling circuitry found in electronic equipment. The present invention responds to changes in ambient temperature of the area or component to be cooled by micro-adjusting fan speed to accommodate more or less cooling capacity, as needed, thereby maintaining precise temperatures in the subject region or circuit. The fan increases rotation speed of the motor as a function of temperature measured by a temperature-sensing subcircuit such as a thermistor, thermistor array or equivalent means. Unlike related-art fans, changes in fan speed can be made across a continuous spectrum of values, not merely at discrete intervals—thus maximizing cooling capacity while minimizing unwanted effects such as noise and power consumption.

Additionally, the present invention teaches mechanisms which permit the fan to calculate specific speed values for particular self-calibrated temperatures, and thus adjusting for manufacturing tolerances contained within its constituent electronic components. The fan is placed in a fixed-temperature region when first powered on. An error offset value which compensates for the initial tolerance of the circuitry is then stored in non-volatile memory via a software routine stored in a microcontroller. Subsequent temperature measurements during normal operation mode are then corrected using the stored offset value. Highly precise control over fan speed can thereby be obtained while simultaneously containing manufacturing costs. The self-calibrating fan thereby obviates the need for expensive calibration techniques during the manufacturing stage—such as circuit trimming, using expensive components with low tolerances, or discarding large numbers of unacceptable units—since any tolerance within a reasonable range can be compensated for using the offset value.

DETAILED DESCRIPTION OF THE INVENTION

Figure 1B:
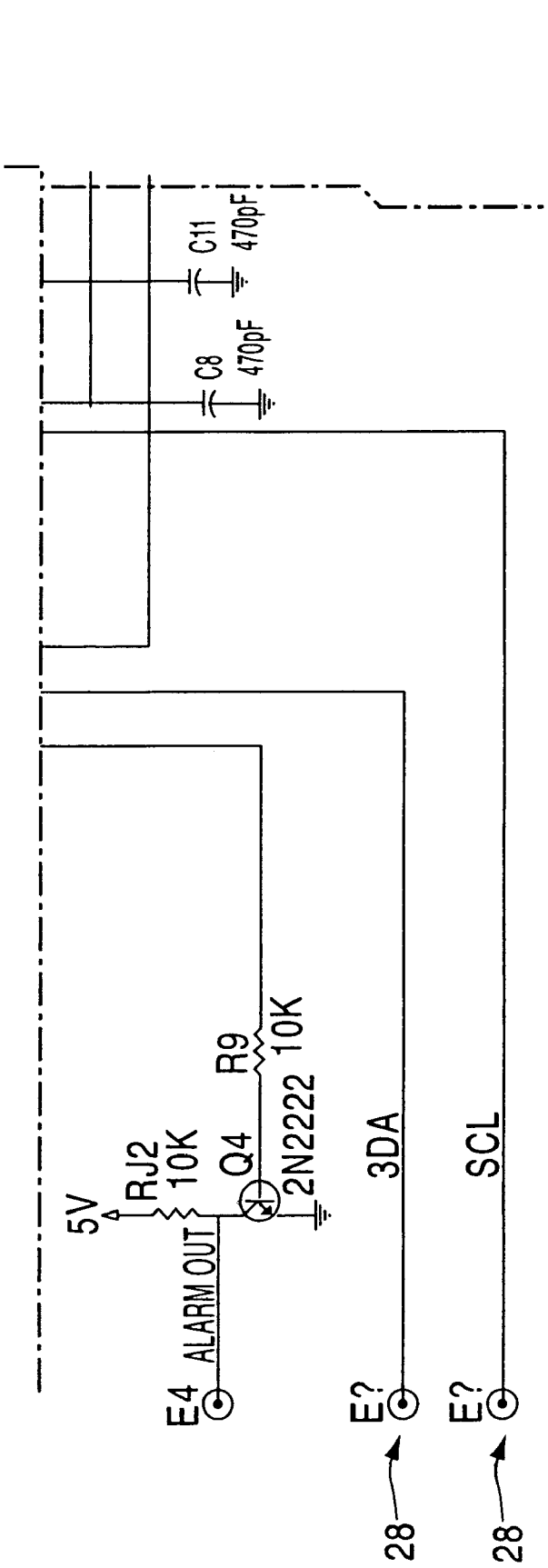
FIG. 1 A circuit specification showing an embodiment of the disclosed apparatus.
Figure 1C:
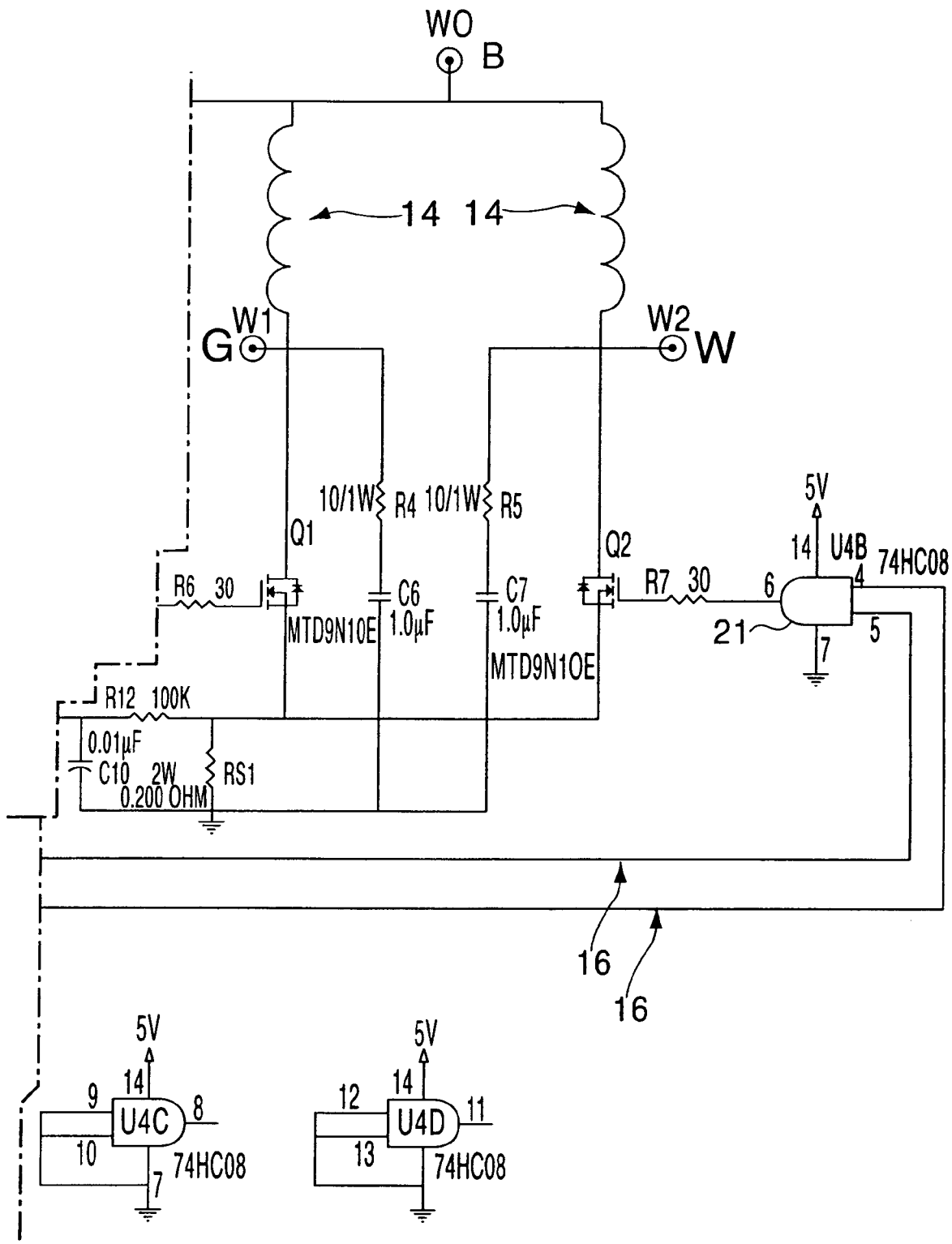

FIG. 1 describes the claimed device via a schematic diagram of the circuit elements contained therein. A temperature-sensing subcircuit 13 such as a thermistor, thermistor array or other equivalent means, is attached to a microcontroller 12 via a temperature-signal line 15. The microcontroller 12 is also connected to a fan motor 14 via a commutation-signal line 16. The temperature-sensing subcircuit 13 is used for reading temperatures in the region, device or circuit to be cooled. The temperature-signal line 13 transmits to the microcontroller 12 a voltage reading from across the temperature-sensing subcircuit 13. The microcontroller 12 carries out many tasks including but not limited to, determining whether the device has been calibrated or not, storing an offset value to compensate for tolerances within the temperature-sensing subcircuit 13, adjusting the voltage value read from across the temperature-sensing subcircuit 13 to arrive at an adjusted temperature, calculating a motor speed corresponding to the adjusted temperature, generating a commutation signal to send to the fan motor 14 via the commutation-signal line 16, and waiting an interval of time before repeating one or more of these processes.

Figure 2:
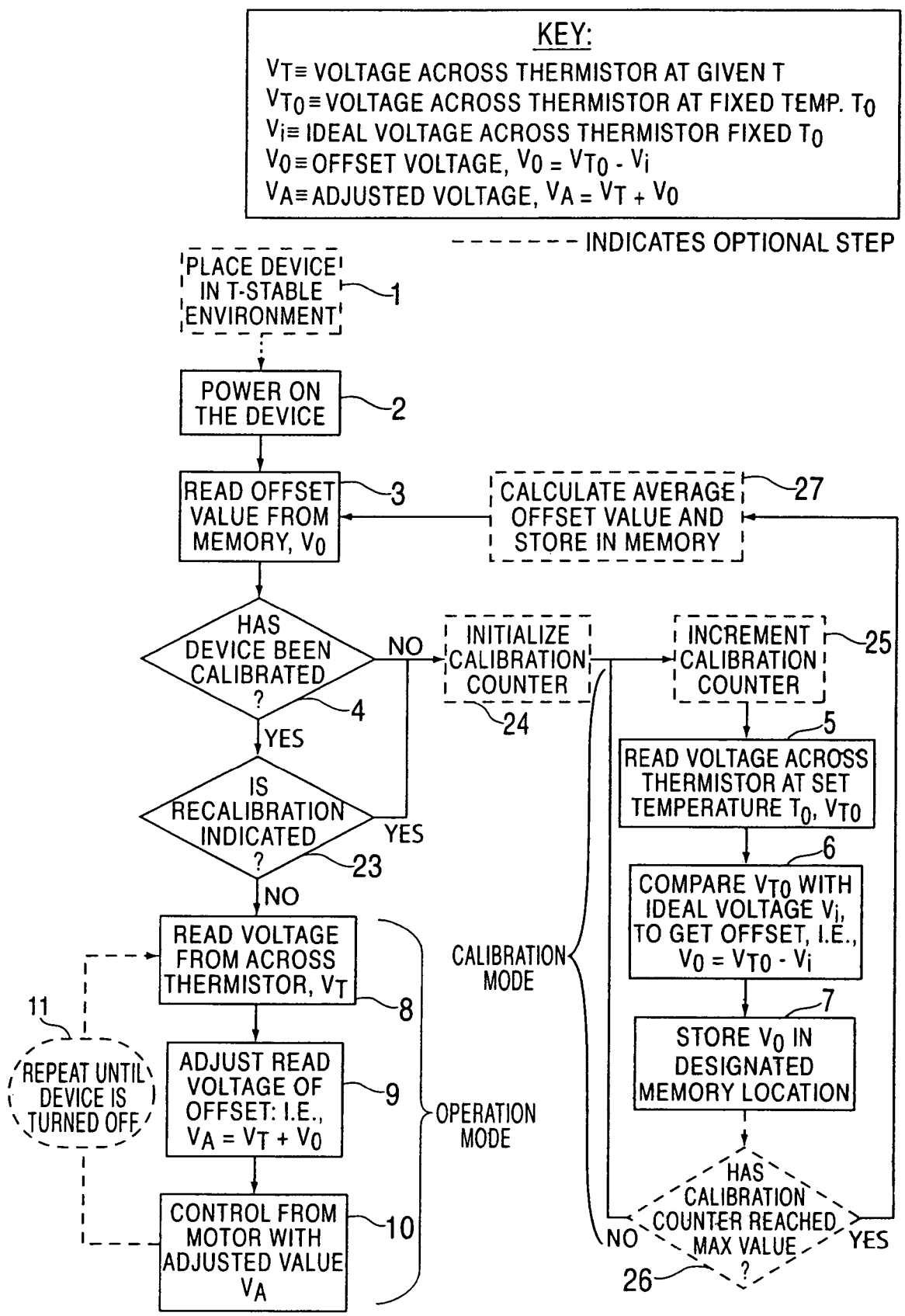
FIG. 2 A flowchart showing the calibration routine of the disclosed method.

Other elements depicted in FIG. 2 include a hall monitor 20 for detecting actual motor speed for use in calculating and revising the commutation signal, in accordance with methods well known in the prior art. Also depicted are logical AND-gates 21 and 22 for use in generating the commutation signal and transmitting it to the motor 14 by methods well known in the prior art. Otherwise depicted are elements of a standard dc-brushless motor well known in the prior art. U.S. Pat. No. 6,611,117 B1 discloses a method and apparatus for controlling a brushless dc motor with a drive circuit. That patent is incorporated herein by reference and describes in sufficient detail the additional software and hardware elements needed to effectively run a brushless dc motor with a microcontroller.

The method for self-calibrating a cooling fan used in cooling electronic devices is set out in flowchart form in FIG. 2. To assure accurate calibration, the fan is first placed into a region of known, fixed and stable temperature, Step 1 of FIG. 2, preferably at 25° C.—such as a heat bath, a fixed-temperature region, or even a temperature-stable factory floor. Alternatively, fixed-temperature air could be flowed over the thermistor or thermistor array 13 to achieve the same result. In one embodiment of the invention, the temperature of the fixed-temperature region must be known in advance, so as to be programmed into the microcontroller code 17. The self-calibrating process takes place, when the fan is first powered on, Step 2, and enters into a calibration mode, Steps 5, 6, and 7.

Calibration mode, as described in Steps 5, 6 and 7 of FIG. 2, begins upon first power-up of the fan when the microcontroller 12—via the microcontroller code 17 reading from the programmable non-volatile memory that has been set aside for storing an offset value 18 when the fan is running in operation mode—performs a read function, Step 3, from the offset-value memory location 18. Since no value has been stored in the offset memory location 18, a read function will return a result of zero or some other specified value, indicating to the microcontroller 12 that a calibration must take place to generate the appropriate offset value. Alternatively, upon subsequent power-ups, the read function returns a non-zero result indicating fan operation is to proceed in operation mode and bypassing calibration mode. This branching-decision logic is indicated in FIG. 1 as Step 4.

Actual calibration, Steps 5, 6 and 7, then proceeds with the microcontroller 12 (again via the controller code 17) effecting a voltage reading, Step 5, from across the terminals of the temperature-sensing subcircuit. A temperature reading of the fixed-temperature region is thereby effected, but this reading contains an error portion corresponding to the tolerances of the componentry. This reading is then transmitted back to the microcontroller 12.

In accordance with the microcontroller code 17, the microcontroller 12 then compares in Step 6 the read temperature value to an ideal value corresponding to the fixed-temperature region 1 which has been included in the program and stored in memory. The difference between the measured voltage and the expected voltage provides a precise offset value which accounts for the manufacturing tolerances inherent in the temperature sensing circuitry. The offset value is then stored in Step 7 in a designated location 18 of programmable, non-volatile memory within the microcontroller 12 for use in subsequent fan-speed calculations. Calibration mode is then complete, and the fan is ready for operation mode as depicted in Steps 8 through 11 in FIG. 2.

Since the offset value is stored in non-volatile memory, future reads from the memory location will return a non-zero result (in all but the most highly unlikely scenario where the componentry has a perfectly zero tolerance), thereby bypassing calibration mode on future power-ups and going directly into operation mode, Step 7, wherein the offset value will be used to adjust all subsequent voltage readings from across the terminals of the temperature-sensing subcircuit 13.

One embodiment of the self-calibrating fan contains means for taking multiple readings of the difference between the actual and ideal voltage readings across the temperature-sensing subcircuit when placed in the temperature-stable environment. Such means are accomplished by including in the microcontroller code 17 additional instructions for initializing, Step 24, and incrementing or decrementing, Step 25, a calibration counter once program flow has entered calibration mode, Steps 5 through 7, and for determining, Step 26, whether the calibration counter has reached its maximum value after successive loops of reading actual voltage, Step 5, comparing to ideal voltage, Step 6, and storing the offset, Step 7, have been performed. In this manner, multiple readings of the offset voltage value can be taken, and then averaged, Step 27, weighted or otherwise, and stored as the actual offset value used to adjust future temperature readings taken during operation mode. Greater accuracy in measuring the offset is thereby obtained.

Additionally, the inventor envisions as an alternative embodiment for practicing the invention one which contains means to manually affect recalibration of the fan, so that calibration can take place at times other than just automatically at initial power up. Such means consist of including within the microcontroller code 17 additional instructions to query whether manual recalibration is indicated in Step 23. For example and not by way of limitation, such indication of recalibration can take the form of the microcontroller reading a signal on designated pins 29 attached to terminals 28 adapted for a simple user-operable input device such as a no-pull, single-throw switch connected to ground. By this means, the user can indicate to the microcontroller 12 to recalibrate the fan by manipulating the switch. In this embodiment, however, it is incumbent upon the user to know the fixed temperature value programmed into the microcontroller code 17. Other means for communicating a binary operation, such as whether to calibrate or not, than a no-pull, single-throw switch may also be employed.

Subsequent manual recalibration raises the difficulties of knowing the pre-programmed calibration temperature, and securing a region at that precise temperature. As an alternative embodiment, therefore, means can be employed to permit the user to manually input into the microcontroller memory the fixed temperature of the region to be used in calibration. Such means are widely known in the prior art, and can be accomplished by use of a small keyboard, one or more DIP switches, a small dial or rheostat, a keyboard or micro-keyboard, a serial communications port generally, an RS232 port, an I2C port, a ConBus port, a USB port or other equivalent means for inputting a single data field into a memory location on a microcontroller. Alternatively, the calibration temperature can be automatically input via a low tolerance, high accuracy heat probe programmed to read the temperature of the subject region or device and communicate such data through the above-mentioned communications ports to the microcontroller. A probe of this type could be manufactured for special use by technicians for recalibrating fans of the type disclosed herein. By this means, technicians could effect subsequent manual recalibration of the fan anywhere at any time and at any reasonable temperature—without having to know the programmed calibration temperature, or having to secure a calibration region at that value.

Figure 3:
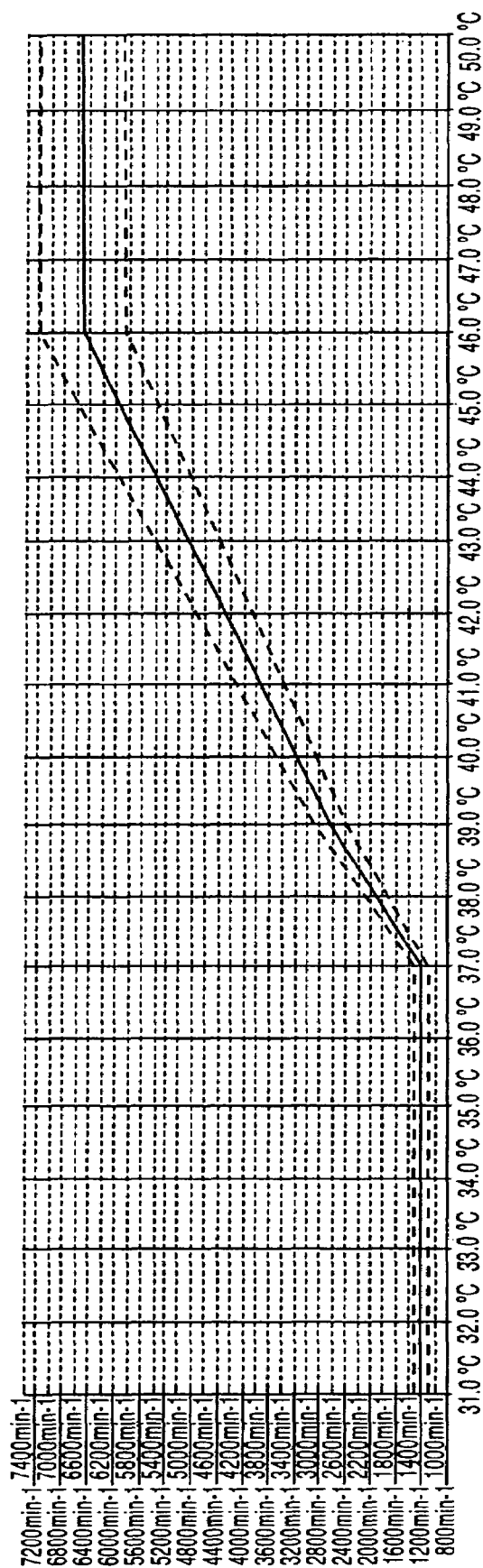
FIG. 3 A sample temperature vs. fan-speed plot.

During operation mode, Steps 8 through 11, the thermistor or thermistor array 13 has already been placed in the vicinity of the device to be cooled, such as a computer's motherboard or other heat-sensitive circuit, during installation of the fan. Alternatively, the thermistor or thermistor array can be incorporated into the circuit whose temperature is to be monitored. Additionally, the heat-sensing subcircuit 13 can be connected to the hub of the fan 14 which is mounted inside of the area, component or circuit to be cooled. Voltage across the thermistor or thermistor array 13 is then read and sent via a temperature control signal 15 to the microcontroller 12. To compensate for the known tolerances in the temperature sensing circuitry, the microcontroller 12 via control code 17 then adjusts the temperature control signal 15 with the offset value to create an output value representative of the true temperature. Then, using the adjusted "true" temperature, the microcontroller consults a speed table, formula, subroutine, or other means 19 for mapping motor speed to temperature (such as represented in FIG. 3, by way of example and not limitation) also stored in memory or contained in the control code 17, for generating a motor speed value which is transmitted to the motor 14 of the cooling fan, via a commutation signal 16 of a specified frequency or some other equivalent means. Alternatively, the microcontroller code 17 can contain a subroutine 19 for calculating fan speed from an input temperature 15. The fan motor 14 is then activated such that its speed is a function of the motor-speed or commutation signal 16.

Another temperature reading is taken at a set time interval included in the control code's programming 13—such interval ranging from a few microcontroller clock cycles to an observable time interval such as seconds, minutes or even longer. The interval, moreover, need not be fixed, but can be set according to a formula, data table or other equivalent variable means. Through the above-outlined procedure, the motor speed is then reset, and a stochastic process, Step 11, of temperature readings and motor-speed settings is thereby established until the fan is powered down. This stochastic process, Step 11, thus allows for a tightly controlled temperature in the subject region or device.

FIG. 3 depicts in a purely mathematical form a typical motor-speed vs. temperature function for use by the microcontroller 12. The motor-speed vs. temperature function can be incorporated into the device in a number of ways, including but not limited to, a data table 19, a computer-code subroutine 19, and a command line in the microcontroller code 17. The motor-speed vs. temperature function accepts as input an adjusted temperature and generates as output a speed setting for the fan motor.

Figure 4:
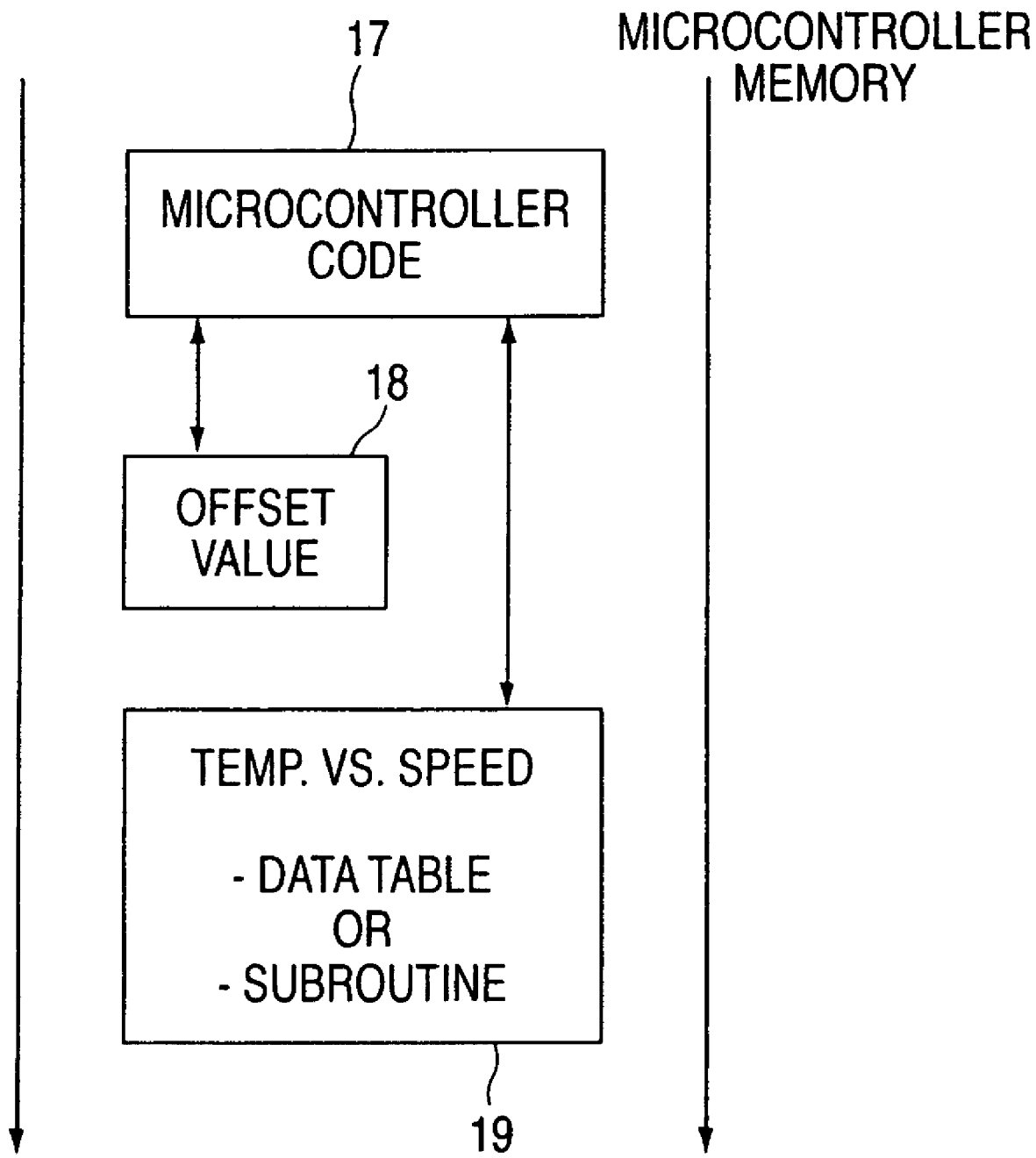
FIG. 4 An illustration of the software elements used by the fan.

FIG. 4 represents the distinct software elements of the disclosed invention. Stored in programmable, non-volatile memory, either in the microcontroller 12, or elsewhere, are a microcontroller code 17, a designated memory location 18, and either a temperature vs. motor-speed data table or subroutine 19. The microcontroller code 17 is used to drive the microcontroller in coordinating the various functions needed to calibrate and control the fan motor. Such functions include but are not limited to reading a voltage from across the temperature-sensing subcircuit, as in Steps 5 and 8, comparing the read voltage value to an expected voltage value, Step 6, storing the offset thereby obtained, Step 7, into a specified memory location 18, adjusting a read voltage value, Step 9, with the offset value, controlling fan speed, Step 10, and repeating, Step 11, the steps of reading temperature, adjusting for voltage offset, and controlling fan speed at a fixed for variable interval. The offset-value memory location 18 is a designated location in memory for storing a voltage value representing the difference between the voltage read from across the temperature-sensing subcircuit 13 at a given temperature and the expected value at that temperature. The offset value provides a convenient way to adjust voltages to account for manufacturing tolerances within the device's circuitry, including but not limited to manufacturing tolerances from the temperature-sensing subcircuit 13. The temperature vs. speed data table or subroutine 19 represents a computer-memory means for generating a motor-speed value output from a given temperature value input. The function encapsulated within the temperature vs. speed data table or subroutine can be represented by way of example as the plot contained in FIG. 3. Several means are envisioned for achieving the mapping from input temperature to output fan speed. Such means include a data table, a computer-code subroutine, one or more lines incorporated into the body of microcontroller code, or even a physical means.

What is claimed is:

1. An electronic circuit for self-calibrating an electronic cooling fan, comprising:
    a temperature-sensing subcircuit for measuring the temperature of a device, region or circuitry to be cooled;
    a microcontroller connected to the temperature-sensing subcircuit, for controlling signals within the circuit, adjusting measured voltage values with an offset value, and determining whether operation should proceed in calibration mode or in operation mode; and
    a fan, with an electronically controlled motor, connected to the microcontroller, for providing airflow to the subject device, region or circuitry to be cooled,
    wherein the microcontroller measures the voltage value across the temperature-sensing subcircuit and computes the offset value as a difference between the measured voltage value and an ideal voltage value during the calibration mode, and adjusts subsequently measured voltage values with the offset value,
    wherein the circuit is capable of calibrating itself to account for tolerances in its temperature reading sensitivity by reading temperatures of the subject device, region or circuit to be cooled and then using calibration data in regulating fan-motor speed thereafter.

2. The circuit of claim 1, wherein the microcontroller contains a microcontroller code, a designated memory location for storing an offset value, and at least one of a subroutine, one or more memory locations containing a data table, a microcontroller instruction code line, or other means for mapping fan-motor speed to temperature according to a defined speed-temperature curve.

3. The circuit of claim 2, wherein upon initial power-up of the circuit, the microcontroller performs a read function of the designed offset memory location and compares the read value to a designated value to determine whether to commence operation in either calibration mode or operation mode.

4. The circuit of claim 2, wherein upon subsequent power-ups of the circuit, after reading an offset value and comparing the read value to a designated value to determine whether to enter into calibration mode or operation mode, the microcontroller detects whether recommencing calibration mode is indicated, and if so commences calibration mode, and if not commences operation mode.

5. The circuit of claim 4, wherein the microcontroller detects whether recalibration is otherwise indicated by reading a signal from a user interface, such as one of a switch, a DIP switch, a keyboard, or other equivalent input device.

6. The circuit of claim 2, wherein the offset value is stored in the designated memory location, wherein subsequent to the calibration mode, the microcontroller commences operation in the operation mode.

7. The circuit of claim 6, wherein the ideal voltage value is input through at least one of a communications port, a switch, a DIP switch, a probe, a keyboard or other means for manually or automatically inputting a data field into a microcontroller.

8. The circuit of claim 7, wherein during calibration mode the microcontroller performs the following additional steps:
    initializes a calibration counter variable;
    increments the calibration counter variable;
    repeats the steps of measuring a voltage value, comparing the measured voltage value to an ideal voltage value, computing an offset value, and storing the offset value;
    tests whether the calibration counter variable has reached its designated termination value;
    computes, when the calibration counter variable has reached its designated termination value, an average offset value, weighted or otherwise, from each of the offset values stored in memory;
    stores the average offset value in memory;
    terminates calibration mode thereby entering into operation mode; and
    uses the average offset value thereafter while in operation mode as the offset value.

9. The circuit of claim 7, wherein during operation mode, the microcontroller:
    measures the voltage across the temperature-sensing subcircuit;
    computes an adjusted voltage value by adding or subtracting the offset value stored in the designated memory location from the measured voltage value;
    calculates a fan-motor speed by using the adjusted value and at least one of a data table, a subroutine, a microcontroller instruction code line, or other means for mapping fan-motor speed to temperature; and
    controls fan-motor speed via a commutation signal established by the calculated fan-motor speed.

10. The circuit of claim 9, wherein after a given time interval, the microcontroller again measures the voltage across the temperature-sensing subcircuit, computes the adjusted voltage value, calculates a fan-motor speed, and controls fan-motor speed via a commutation signal.

11. The circuit of claim 10, wherein the given time interval is one of either a fixed or variable time interval.

* * * * *